(12) United States Patent
McCann

(10) Patent No.: US 6,407,605 B1
(45) Date of Patent: Jun. 18, 2002

(54) VARIABLE HYSTERESIS CIRCUIT

(75) Inventor: Gerard O. McCann, Layfayette, IN (US)

(73) Assignee: Wabash Technology Corporation, Arlington Heights, IL (US)

( * ) Notice: Subject to any disclaimer, the term of this patent is extended or adjusted under 35 U.S.C. 154(b) by 0 days.

(21) Appl. No.: 09/702,558

(22) Filed: Oct. 31, 2000

Related U.S. Application Data

(60) Provisional application No. 60/162,647, filed on Nov. 1, 1999.

(51) Int. Cl.[7] .............................................. H03K 3/037
(52) U.S. Cl. ...................................................... 327/205
(58) Field of Search ............................ 327/68, 74, 205, 327/206

(56) References Cited

U.S. PATENT DOCUMENTS

| | | | | | |
|---|---|---|---|---|---|
| 4,438,349 A | * | 3/1984 | Shoji | ............................ | 327/78 |
| 4,806,791 A | * | 2/1989 | Mizuide | ..................... | 327/205 |
| 5,420,530 A | * | 5/1995 | Mita | ........................ | 327/74 |
| 5,440,252 A | * | 8/1995 | Lee | ............................. | 327/47 |
| 5,523,709 A | * | 6/1996 | Phillips et al. | .............. | 327/205 |
| 6,218,870 B1 | * | 4/2001 | Wilson | ........................ | 327/34 |

* cited by examiner

Primary Examiner—Toan Tran
(74) Attorney, Agent, or Firm—Trexler, Bushnell, Giangiorgi, Blackstone & Marr, Ltd.

(57) ABSTRACT

The present invention provides a circuit which is configured to apply variable hysteresis to an input signal, where the level of hysteresis applied to the input signal is dependent upon the frequency of the input signal. Use of this circuit in a vehicle's anti-lock braking system allows for more efficient and effective braking.

16 Claims, 2 Drawing Sheets

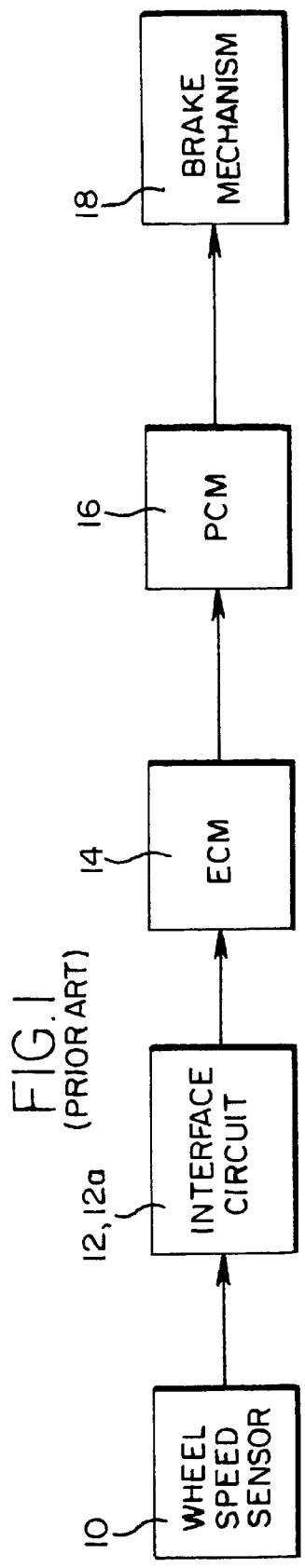
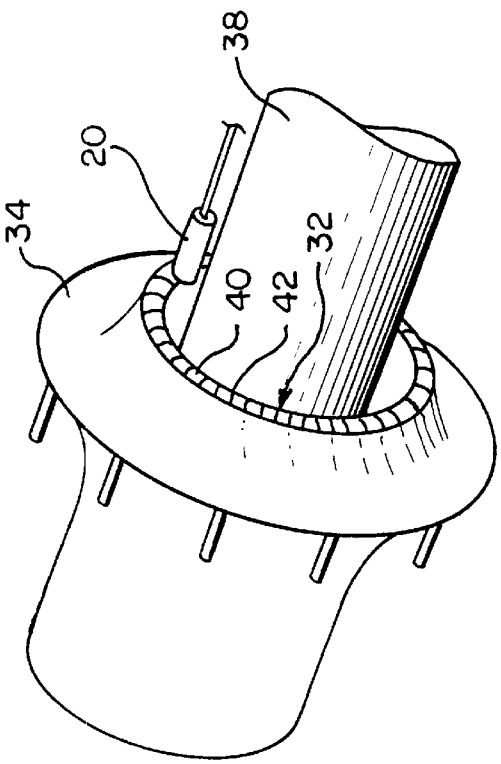
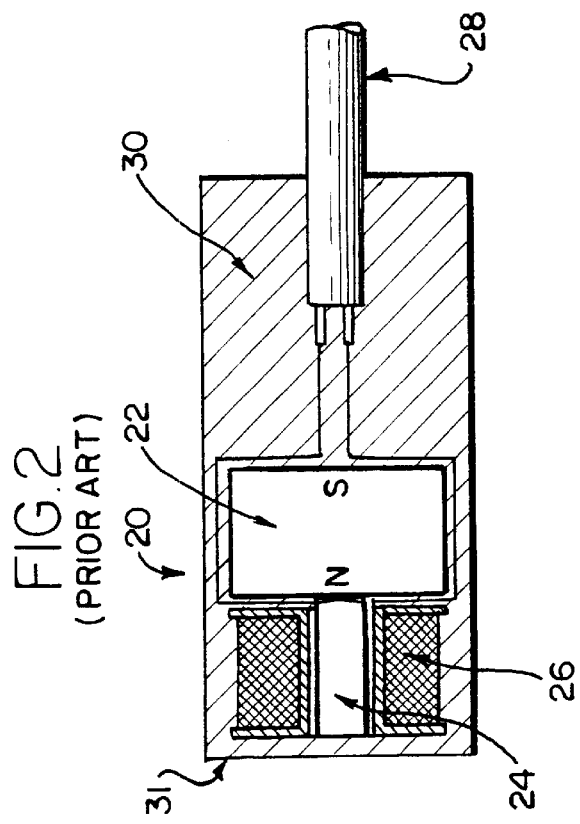
FIG. 1 (PRIOR ART)
FIG. 2 (PRIOR ART)
FIG. 3 (PRIOR ART)

VARIABLE HYSTERESIS CIRCUIT

RELATED APPLICATION

This application claims the benefit of the U.S. Provisional Application, Serial No. 60/162,647, filed Nov. 1, 1999.

BACKGROUND OF THE INVENTION

The present invention relates generally to circuits which provide a hysteresis function, and more specifically relates to circuits used in anti-lock braking systems(ABS).

ABS used in conjunction with air-braked truck trailers are in common use. An objective of an ABS is to allow the wheels of a vehicle to continue to rotate during braking, including heavy braking. Keeping the wheels moving during braking generally provides more efficient braking. As shown in FIG. 1, an ABS generally consists of wheel speed sensors 10, an Interface circuit 12, an Electronic Control Module (ECM) circuit 12, an Electronic Control Module(ECM) 14, a Pneumatic Control Module (PCM) 16, and brake mechanisms 18 associated with the wheels of the vehicle. The ECM 14 is sometimes referred to as the Electronic Control Unit (ECU). The PCM 16 is sometimes referred to as the modulator and, in some anti-lock braking systems, the PCM is integrated into another component such as a relay valve.

An ABS for air brakes generally works as follows. Each wheel speed sensor 10 measures the speed of a wheel and forwards this information, in the format of an electrical signal, through the interface circuit 12. The interface circuit 12 transforms the electrical signal produced by the wheel speed sensor 10 into a square wave. The square wave is then used by the ECM 14 to calculate wheel speed information. The wheel speed information is then transmitted to the PCM 16 which sends instructions to the braking mechanisms 18 which modify the air pressure to control the braking level. This braking process is well known and is described in numerous patents and in pending, U.S. patent application Ser. No. 09/306,921, which is hereby incorporated herein in its entirety by reference.

One type of wheel speed sensor which is commonly used in ABS systems is a variable reluctance (VR) sensor. A typical VR sensor 20 is,shown in FIG. 2, and consists of a permanent magnet 22, a magnetically soft pole piece 24 and a coil of wire 26 wound around the pole piece 24. A magnetic field extends from the permanent magnet 22, through the pole piece 24 and coil 26 out into the air space proximate the face 31 of the VR sensor 20. The return path of the magnetic field is from the air space proximate the face 31 to the opposite end of the permanent magnet 22.

Each end of the coil 26 is attached to a cable 28 which extends through the sensor housing 30 opposite the face 31 of the VR sensor 20. The electrical signal produced by the VR sensor 20 flows through the cable 28. Another type of sensor commonly used in ABS's is a Hall sensor, which construction is generally known in the art.

As shown in FIG. 3, when a VR sensor 20 is employed in an ABS, the VR sensor 20 is typically associated with a toothed wheel 32 (sometimes referred to as an exciter ring or a tone wheel). Usually in the truck and trailer industry, the toothed wheel is attached directly to the back of the wheel hub 34 and rotates with the road wheel (not shown). The VR 20 is mounted so that the face 31 of the VR sensor is proximate the toothed wheel 32 and perpendicular to the axle 38.

The toothed wheel 32 includes a row of teeth 40 around the perimeter of the toothed wheel 32. A gap 42 is located on either side of each tooth 40 along the perimeter of the toothed wheel 32. As the road wheel rotates, the teeth 40 of the toothed wheel 32 pass the face 31 of the VR sensor 20. Because the toothed wheel 32 is made of a ferrous material, as each tooth 40 approaches the face 31 of the VR sensor 20, the magnetic field increases. As each tooth.40 becomes further away from the face 31 of the VR sensor 20, the magnetic field decreases. The magnetic field, or flux, is greatest when the tooth 40 is in front of the VR sensor 20. Conversely, when a gap 42 is in front of the VR sensor 20, the flux is least. Thus, as the teeth 40 pass the face 31 of the VR sensor 20, the flux increases and decreases.

Through basic electromagnetic theory, this changing flux induces an AC voltage signal across the coil 26. The induced voltage is ideally a sinusoidal signal. The frequency of the signal is directly proportional to the number of teeth 40 which pass the face 31 of the VR sensor 20 in a given period of time. The amplitude of this voltage signal is proportional to the speed of the teeth 40 passing the face 31 of the VR sensor 20. When the road wheel is turning at high speeds, the AC signal has a high amplitude. When the road wheel is turning at low speeds, the AC signal has a low amplitude. As the wheel speed becomes very slow, the signal becomes generally unreliable. Typically, designers of ABS's assume that when the wheel speed is less than 2 mph, the signal, received from each wheel sensor is unreliable. The speed at which the signal becomes unreliable, however, is dependent upon many factors of the overall system design, including, for example, the sensitivity of the circuit, the VR sensor, the toothed wheel, and the gap maintained between the face of the VR sensor and the toothed wheel.

Because the signal received by the ECM will be used to generate wheel speed information, it is critical that this signal be as accurate as possible. However, certain factors create imperfections in the signal. These imperfections can result in the ECM 14 incorrectly calculating the wheel speed.

One factor which adversely affects the sinusoidal signal produced by the VR sensor is mechanically induced noise. At times, even though the vehicle is moving, the road wheel is not rotating. The road wheel therefore rubs on the road surface producing a noise sometimes referred to as tire scrub. This noise may additionally be amplified by suspension resonances. Because sensors, such as VR sensors, are generally prone to mechanically induced noise, the sensor will produce significant AC voltage even though the wheel is stationary. Therefore the sensor will send an output signal which indicates that the road wheel is rotating when, in fact, it is stationary. This situation is further complicated by the fact that the mechanical noise tends to be at a relatively high frequency. Thus the high frequency noise causes a great rate of change of flux. Because a VR sensor, for example, responds to the rate of change of flux, the resulting signal will have significant frequency imperfections.

Other factors such as electrical interference effects from onboard or off board radios, radars and other radio frequency interference affect the overall sensing scheme. Depending on the severity, these effects may combine and prevent the ECM 14 from operating correctly and imperfections in control performance may result. When greater degradation of the signal occurs, the ECM 14 determines that the signal is unworkable and the ABS system shuts down.

Another factor which leads to imperfections in the signal produced by the VR sensor is a varying gap between the face 31 of the VR sensor 20 and the toothed wheel 32. As shown in FIG. 3, in the heavy truck and trailer industry, a VR sensor 20 is oriented along the axle of the vehicle resulting in the face of the VR sensor 20 being perpendicular to the wheel hub 34 on which the toothed wheel 32 is mounted. Axial slack causes the gap between the VR sensor 20 and the toothed wheel 32 to vary. When the gap between the VR sensor 20 and the toothed wheel 32 is large, the amplitude of the AC voltage signal is low. When the gap is small, the amplitude of the AC voltage signal is larger. This results in amplitude modulation of the sinusoidal waveform due to variation of the sensor gap.

An additional effect of the varying sensor gap is best understood by considering the concept of a "toothless" tone wheel. Initially, one might conclude that in the case of a toothless wheel, as the wheel rotates no signal would be generated, as there is no variation in the magnetic flux. However, it is clear that as the tone wheel moves axially, the sensor gap varies. Consequently, the magnetic flux also varies and a voltage output from the sensor results. When an actual ("toothed") tone wheel is used, this voltage output is reflected as shifts in the average voltage level of the speed signal. These shifts are typically of a lower frequency than that of the speed signal itself.

The movement of the hub 34 therefore causes imperfections to the sinusoidal waveform. The varying gap therefore results in both amplitude modulation and additional lower frequency components.

It is desirable to eliminate these noise components from the signal transmitted to the ECM 14. However, it is also desirable to track the wheel speed to as low a speed as possible, in order to optimize the performance of the ABS system. These two requirements are in conflict.

Typically, ABS's accomplish this compromise by implementing basic hysteresis functionality in the interface circuit. The basic hysteresis concept proposes that if an effect happens as a result of an increasing stimulus then, for the effect to be reversed, the stimulus must be reduced below the level which caused the effect to occur in the first place.

This hysteresis concept can be implemented in an ABS system to eliminate some of the noise from the signal produced by the wheel sensors 10 (See FIG. 1). The signal produced by each sensor is generally a sinusoidal signal and carries wheel speed information along with a noise component. This signal, generated by the wheel sensors, is transferred to the interface circuit 12. FIG. 4 represents an interface circuit 12 commonly used to implement hysteresis functionality. The signal generated by the wheel speed sensors is received by the interface circuit at the input nodes 44, 46. The interface circuit 12 typically uses a comparator 62 which switches between two stable states (high and low) as the input signal oscillates. As the comparator 62 switches between its two stable states, a square wave is generated at the comparator's output 102. It is this square wave, from the output of the comparator 102, which is then used by the ECM 14 (see FIG. 1) to calculate the wheel speed.

Basic hysteresis functions such that, the signal received by the comparator 62 from the input nodes 44, 46 must be of sufficient amplitude in order to switch the output 102 of the interface circuit 12 from one stable state to the other. The noise portion of the signal is generally not of sufficient amplitude to cause the comparator's output 102 to switch. Thus, if the comparator's output is in the high state, the noise portion of the signal is not generally of sufficient amplitude to cause the comparator 62 to switch to its low state and no change occurs at the output. Because the noise portion of the signal generated by the VR sensor does not affect the comparator's output 102, this basic hysteresis circuit functions so as to essentially eliminate the noise portion of the signal produced by the VR sensor from the output signal.

Although the circuit shown in FIG. 4 is functional, typically additional protection circuitry would be added for long term reliability in the automotive environment. This implementation is well known to those familiar with the art.

Although implementation of this basic hysteresis function eliminates noise from the interface circuit output signal 102, one problem which is encountered through its use, is the loss of low level input signals, which may not be due to noise. Because the amplitude of the signal produced by the VR sensor is proportional to the speed at which the road wheels are rotating, low level signals produced by the VR sensors are often simply an indication that the wheel is rotating slowly. Although this low amplitude signal will be transmitted to the interface circuit 12 when the hysteresis function is implemented, the signal generated by the VR sensor will not have sufficient amplitude to cause the output 102 of the interface circuit 12 to switch states. Thus, although the road wheel is rotating, albeit slowly, the signal produced at the output 102 of the interface circuit 12 indicates that the wheel is not rotating.

Likewise, when the road wheel is rotating, and axial slack causes a gap between the toothed wheel 32 (see FIG. 3) and the VR sensor 20, the signal produced by the VR sensor 20 may not have sufficient amplitude to cause the output 102 of the interface circuit to switch states. Although the wheel is rotating, the signal produced by the interface circuit 12a indicates that the road wheel is not rotating.

Unfortunately, this inaccurate information indicating that the wheel is not rotating is then passed to the ECM 14. The ECM 14 in turn relays the information to the PCM 16 which may make improper modifications to the air pressure level at the brake chamber 18. This is not particularly a problem if the vehicle is moving very slowly. At such a low speed, whether the ABS functions or not is largely irrelevant. However when the vehicle itself is moving at a higher speed it is important that the wheel speed can be tracked to as low a speed as possible so that optimum ABS control can be maintained. It is highly desirable that the ECM 14 continue to receive wheel speed information from the sensors 10 so that proper braking instructions can be given.

Thus, it would be desirable if there was a high hysteresis level when no signal is present but a lower level once the signal was detected. This would be particularly helpful in rejecting the tire scrub induced noise discussed above but would also minimize the problem of losing the signal at low speeds. At very low speeds no signal would be present, but once the threshold speed was reached than the hysteresis would be deceased so that some reduction in signal amplitude would be tolerated. In effect, there would be hysteresis applied to the hysteresis level.

OBJECTS AND SUMMARY OF THE INVENTION

A general object of an embodiment of the present invention is to provide a circuit configured so as to apply variable hysteresis to an incoming signal.

An object of an embodiment of the present invention is to provide a circuit capable of generating a more accurate output signal.

Another object of an embodiment of the present invention is to provide a circuit configured to apply variable hysteresis to an incoming signal so as to track lower vehicle wheel speeds.

A further object of an embodiment of the present invention is to provide accurate wheel speed information to an ECM.

Another object of an embodiment of the present invention is to provide information to an ECM which will result in more efficient and effective braking of a vehicle.

Yet another object of an embodiment of the present invention is to eliminate noise from the signal produced by a wheel speed sensor.

Briefly, and in accordance with at least one of the foregoing objects, an embodiment of the invention provides a circuit which is configured to apply variable hysteresis to an input signal, such as to a signal which is generated by a wheel speed sensor in an ABS. The level of hysteresis which is applied to the input signal is dependent upon the frequency of the signal generated by the wheel speed sensor. Preferably, the circuit includes a comparator configured to provide positive feed back.

BRIEF DESCRIPTION OF THE DRAWINGS

The organization and manner of the structure and operation of the invention, together with further objects and advantages thereof, may best be understood by reference to the following description, taken in connection with the accompanying drawings, wherein like reference numerals identify like elements in which:

FIG. 1 is a block diagram of a typical ABS;

FIG. 2 is a partial cross-sectional view of a typical VR sensor;

FIG. 3 is a perspective view showing the VR sensor of FIG. 1 incorporated into a wheel sensing system, wherein the VR sensor is associated with a toothed wheel on a wheel hub;

DETAILED DESCRIPTION OF THE ILLUSTRATED EMBODIMENT

Figures 4, 5:
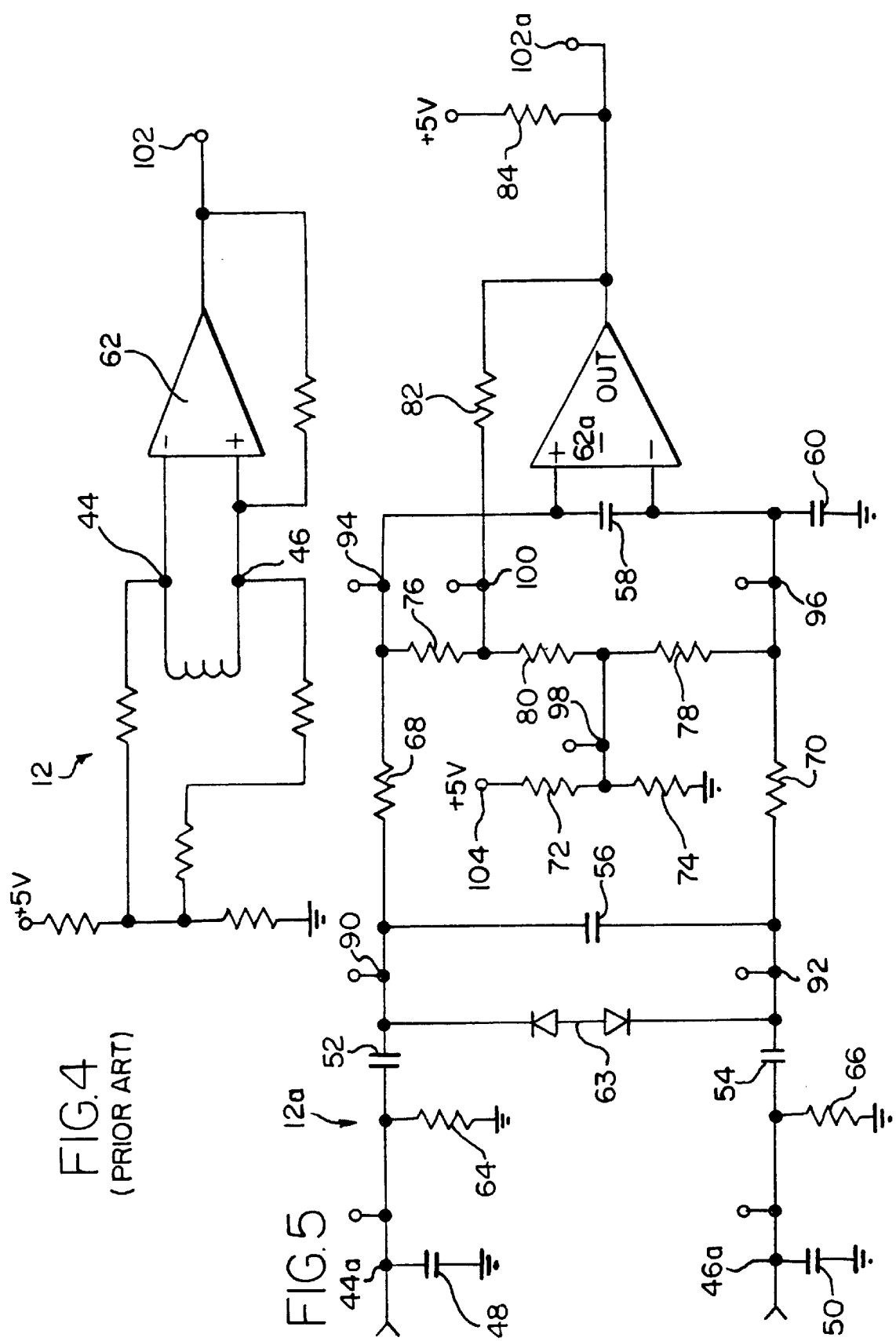
FIG. 4 is a circuit diagram illustrating a prior art hysteresis circuit.
FIG. 5 is a circuit diagram illustrating a variable hysteresis circuit which is in accordance with an embodiment of the present invention.

While the invention may be susceptible to embodiment in different forms, there is shown in the drawings, and herein will be described in detail, a specific embodiment with the understanding that the present disclosure is to be considered an exemplification of the principles of the invention, and is not intended to limit the invention to that as illustrated and described herein.

As shown in FIG. 5 and as will be described in detail hereinbelow, an embodiment of the present invention provides a circuit 12a which is configured to apply variable hysteresis to an input signal. As such, the circuit 12a provides improved noise rejection and other advantages. It is advantageous to employ such a circuit in connection with an ABS as shown schematically in FIG. 1. Specifically the circuit 12a can be used as the interface circuit between each wheel sensor 10 and the ECM 14.

One advantage of the interface circuit 12a shown in FIG. 5 is that when the road wheels are rotating slowly, a signal which more accurately reflects the speed of the wheels is provided at the output 102a of the interface circuit 12a. The signal at the output 102a is then used by the ECM 14 (see FIG. 1) to provide more accurate information to the PCM 16 which can apply more precise braking levels. An additional advantage of the circuit 12a shown in FIG. 5 is that the negative effect of the axial gap between the face 31 of the VR sensor 20 and the toothed wheel 32, caused by axial slack is reduced.

The signal produced by a wheel speed sensor 10 (see FIG. 1), such as a VR sensor 20 as shown in FIG. 2, is transmitted to the interface circuit 12a by way of input nodes 44a and 46a (see FIG. 5). As shown in FIG. 5, the interface circuit 12a preferably includes several capacitors (48, 50, 52, 54, 56, 58, 60), a comparator 62a, a dual zener diode 63, and several resistors (64, 66, 68, 70, 72, 74, 76, 78, 80, 82, 84). Several reference nodes are also identified within the circuit (90, 92, 94, 96, 98, 100, 102a, 104).

The basic hysteresis function is achieved through the use of a comparator 62a. The comparator 62a is preferably an LM2903 comparator which has two stable states. When a signal is provided to the input nodes 44a and 46a of the interface circuit 12a, the signal from input node 44a flows to node 90 and onward to the comparator's non-inverting input node 94, and the signal at node 46 flows to node 92 and onward to the comparator's inverting input node 96.

In the preferred embodiment, resistor 84, a 10 KΩ resistor, is provided between the output 102a of the comparator 62a and a 5 volt DC voltage. Resistor 82, which is preferably a 475 KΩ resistor, provides a positive feedback path from the output 102a of the comparator 62a to implement the basic hysteresis function. No signal will be generated at the output 102a of the comparator 62a until a signal of sufficient amplitude is attained on the input nodes 94, 96 of the comparator 62a. Additionally, due to the hysteresis functionality of the circuit, once a signal has been generated at output 102a, the output will not switch states unless the signal at the input nodes 94, 96 of the comparator 62a is of sufficient amplitude. Thus, the signal provided to the non-inverting input node 94 and the inverting input node 96 of the comparator 62a, in addition to the previous output state, will determine the state of the output 102a. This first level of hysteresis helps to eliminate noise from the signal received at the input nodes 44a and 46a.

When the comparator output 102a switches from one stable state to the other, resistor 82 tends to pull reference node 100 high. How high reference 100 is pulled will depend upon the impedance seen between reference node 100 and an AC ground point. The impedance seen at reference node 100 includes resistor 64, preferably 4.75 KΩ, and resistor 68, preferably 47.5 KΩ, due to coupling provided by capacitor 52.

Capacitors 52 and 54, each of which are preferably 0.1. μF, provide a bridge between the ground referenced part of the circuit at the input nodes 44a and 46a and the biased portion of the circuit at node 98. Capacitors 52 and 54 provide this bridge by coupling the AC signals and blocking DC signals or those signals with very low frequency components. As input nodes 44a and 46a receive a signal, capacitor 52, and capacitor 54, couple this AC signal and deliver it to the biased portion of the circuit. Initially, as capacitors 52 and 54 are charging, the impedance at reference node 100 does not include the impedance of resistor 64 and resistor 68. When a signal of a sufficient amplitude is received by the input nodes 44a and 46a to cause the comparator 62a to switch, node 100 is pulled high. Immediately after switching, the impedance at reference node 100 includes the impedance of resistor 64 and resistor 68. The decreased impedance at reference node 100 results in a lower level of hysteresis. Thus, the hysteresis which is in effect immediately after switching is lower than the hysteresis which was in effect before switching. To switch back to the previous state at this lower level of hysteresis, a differential signal of opposite polarity but of lesser magnitude is all that is required. The result is that switching will occur at a lower wheel speed than the speed initially required to cause the output to switch, when the first level of hysteresis was in effect. Additionally, lower amplitude signals which result from axial gap will also be sufficient to cause the output to switch.

Some time after switching has occurred (how long depends upon the time constant chosen), capacitor 54 will charge and the impedance at reference node 100 will no longer include resistors 64 and 68 and the effect of the lower level of hysteresis will be nullified.

By choosing the time constant correctly, the effect is such that when the delay between positive and negative switches is not too long (i.e. if the wheel continues to rotate), resistor 64 and resistor 68 impact the overall impedance at 100. When the impedance at node 100 decreases, the level of hysteresis is lowered and therefore lower wheel speed can be tracked. However, if switching has not occurred for some time (i.e. the vehicle has stopped moving), then capacitor 52 charges. When capacitor 52 is charged, resistor 64 and resistor 68 do not affect the impedance at 100 and the level of hysteresis increases. Generally, the lower the impedance at node 100 the lower the hysteresis, and the higher the impedance at node 100 the higher the hysteresis. In effect, the level of hysteresis is variable with frequency.

Component values can be chosen to achieve desired characteristics. For example, to avoid intermittent signals when the road wheel is rotating slowly, the design should be such that a significant difference occurs between the hysteresis value for zero frequency and the frequency where it is expected that an output signal will be generated. For example, this frequency might be 20 Hz in a particular ABS system design.

To properly function, it is necessary that at least one of the comparator's input nodes 94 and 96 be biased within the input common mode range of the comparator 62a. The common mode range of the LM2903 comparator, for example, is 0.0 to 3.0 volts. Therefore, it is necessary that either the non-inverting input 94 or the inverting input 96 is biased between 0.0 and 3.0 volts. In the preferred embodiment, for example, a DC voltage of 5.0 volts is applied to node 104 and 1 KΩ resistors are used for resistors 72 and 74. This results in a voltage of 2.5 volts at reference node 98. This voltage is then carried to the non-inverting input 94 through resistors 80, which is preferably a 3.32 KΩ resistor, and 76, which is preferably a 44.2 KΩ resistor, and to the inverting input 96 through resistor 78, which is preferably a 47.5 KΩ resistor.

Capacitors 48 and 50, each of which preferably has a value of 1 nF, provide filtering of high frequency noise to ground and aid in the attenuation of electrical noises resulting from radio frequency interference. Capacitors 48 and 50 also attenuate signal noise originating from mechanical sources. Resistors 64 and 66, each of which preferably has a value of 4.75 KΩ, anchor the input nodes 44a and 46a respectively to ground from a DC perspective. The resulting signal on input nodes 44 and 46 is essentially a ground referenced differential signal.

As described above, capacitors 52 and 54 provide a bridge between the ground referenced part of the circuit at the input nodes 44a and 46a and the 2.5 volt referenced part of the circuit at node 98. The resulting signal, at reference nodes 90 and 92, is essentially a 2.5 volt referenced differential signal. The dual zener diode 63, preferably a model MMBZ5V6ALT1 diode, is designed for transient absorption and limits the instantaneous voltage differential between reference nodes 90 and 92 to approximately 6 volts, either positive or negative. Because the signal at this point is a differential signal centered at 2.5 volts, the voltages at reference nodes 90 and 92 cannot exceed about 5.5 volts (2.5 v+(6/2)) or go below about −0.5 volts (2.5 v (6/2)).

Voltage divider networks limit the voltage at the non-inverting 94 and inverting 96 inputs of the comparator 62. For example, in the preferred embodiment, the voltage divider network implemented by resistor 68, which preferably has a value of 47.5 KΩ, resistor 76 and resistor 80 ensures that the voltage at the non-inverting input 94 can not exceed 4 volts (2.5+(3/2)) or go below 1 volt (2.5−(3/2)). The voltage divider network implemented by resister 70, which preferably has a value of 47.5 KΩ, and resistor 78 similarly constrains the voltage on the inverting input 96. The upper limit of the input common mode range of the LM2903 comparator is 3.0 volts, thus the upper constraint of 4 volts provided by the voltage divider, exceeds this range. However, because of the differential nature of this circuit, if one side of the circuit is towards the upper limit, the other side of the circuit will be towards the lower limit, therefore the voltage at the comparator will be within the input common mode range of comparator 62a. Device specifications allow this condition and the comparator will maintain a proper output state.

Capacitor 56, which preferably has a value of 2.2 nF, and capacitor 58, which preferably has a value of 0.47 nF, each provide additional filtering of higher frequency signal components originating from mechanical sources and also help to filter radio frequency interference.

Reference node 100 is the junction between resistor 82, resistor 76 and resistor 80. The magnitude of the feedback is determined in part by the value of resistor 82 and also by the 1 ratio of resistor 76 to resistor 80. Resistor 82 preferably has a value of 475 KΩ. If a lower value is chosen for resistor 80 and a higher value is chosen for resistor 76 less feedback is provided to comparator 62a. Using the voltage divider network of resistor 76 and resistor 80 keeps the feedback to the comparator low without having to use an excessively large value for resistor 82. In addition to the increased expense of high resistive components and their limited availability, high resistive components are potentially more susceptible to radio frequency interference (RFI). Although it is desirable to keep the feedback to the comparator low, it is not however, desirable to completely eliminate the feedback to the comparator 62a. In order for the output of the comparator to switch cleanly, some positive feedback is often required.

It is noted that when the output switches, say from low to high, the non-inverting input 94 is pulled high as expected. However, reference node 98, thus reference node 96 are also pulled high, but to a lesser extent and therefore do not significantly affect the hysteresis.

Capacitor 60, which preferably has a value of 0.15 nF, is used to help anchor the inverting input 96 during switching. Capacitor 60 prevents capacitive coupling from the output node 102a to reference node 96, which could temporarily defeat the positive feedback provided by resistor 82. This would result in oscillations at the output node 102a during switching and could potentially confuse the ECM 14 (see FIG. 1) which ideally expects a clean square wave. Although capacitor 60 is implemented in the preferred embodiment shown in FIG. 5, capacitor 60 may not be required, depending on the components used in the interface circuit 12a.

The circuit 12a described hereinabove is configured to apply variable hysteresis to an input signal. In addition to providing improved noise filtration, when used in connection with wheel speed sensors, the signal generated by the circuit 12a more accurately reflects the wheel speed. An ABS which employs the circuit 12a described will be able to control braking in a more effective and efficient manner.

While a preferred embodiment of the present invention is shown and described, it is envisioned that those skilled in the art may devise various modifications of the present invention without departing from the spirit and scope of the appended claims.

The invention claimed is:

1. A circuit configured to receive an input signal having a frequency and comprising circuitry which is configured to apply a variable hysteresis to the input signal, wherein a level of the hysteresis applied to the input signal is dependent on the frequency of the input signal; and wherein said circuitry comprises a comparator, having a non-inverting comparator input node and an inverting comparator input node, wherein at least one of said non-inverting comparator input node and said inverting comparator input node is biased within an input common mode range of said comparator, wherein the input common mode range includes an upper limit and a lower limit, and wherein said circuitry is configured to provide a positive-feedback path to said comparator.

2. A circuit as defined in claim 1, wherein said circuit is configured so that when a voltage at said non-inverting comparator input node is proximate said upper limit of said input common mode range, a voltage at said inverting comparator input node is proximate said lower limit of said input common mode range.

3. A circuit as defined in claim 2, wherein said circuit includes at least one circuit element configured to couple said input signal having a varying frequency and block input signals with no frequency component.

4. A circuit configured to receive an input signal having a frequency and comprising circuitry which is configured to apply a variable hysteresis to the input signal, wherein a level of the hysteresis applied to the input signal is dependent on the frequency of the input signal and further comprising at least one circuit element configured to limit a voltage differential of said input signal.

5. A circuit as defined in claim 5, wherein said circuit element configured to limit the voltage differential of said input signal is a dual zener diode.

6. A circuit as defined in claim 2, wherein said circuit comprises at least one circuit element configured to vary an impedance at the non-inverting comparator input and the inverting comparator input, based upon the frequency of said input signal.

7. A circuit as defined in claim 2, wherein said circuit comprises a voltage divider within said feedback path of said comparator.

8. A circuit configured to receive an input signal having a frequency and configured to generate an output signal having a frequency, wherein said circuit is configured to be employed in an anti-lock braking system of a vehicle such that said input signal is dependent on the wheel speed of a vehicle, wherein said circuit comprises circuitry configured to apply a variable hysteresis to the input signal, and wherein a level of hysteresis applied to the input signal is dependent on the wheel speed; and wherein said circuitry comprises a comparator having a non-inverting comparator input node and an inverting comparator input node, wherein at least one of said non-inverting comparator input node and said inverting comparator input node is biased within an input common mode range of said comparator, wherein the input common mode range includes an upper limit and a lower limit, and wherein said circuitry is configured to provide positive-feedback to said comparator.

9. A circuit as defined in claim 8, wherein said circuit is configured so that when a voltage at said non-inverting comparator input node is proximate said upper limit of said input common mode range, a voltage at said inverting comparator input node is proximate to said lower limit of said input common mode range.

10. A circuit as defined in claim 8, wherein said circuit includes at least one circuit element configured to couple said input signal having a varying frequency and block input signals with no frequency component.

11. A circuit configured to receive an input signal having a frequency and configured to generate an output signal having a frequency, wherein said circuit is configured to be employed in an anti-lock braking system of a vehicle such that said input signal is dependent on the wheel speed of a vehicle, wherein said circuit comprises circuitry configured to apply a variable hysteresis to the input signal, wherein a level of hysteresis applied to the input signal is dependent on the wheel speed, and wherein said circuitry further comprises at least one circuit element configured to limit a voltage differential.

12. A circuit as defined in claim 1, wherein said circuit element configured to limit the voltage differential of said input signal is a dual zener diode.

13. A circuit as defined in claim 8, wherein said circuit comprises at least one circuit element configured to vary an impedance at the non-inverting comparator input and the inverting comparator input, based upon the frequency of said input signal.

14. A circuit as defined in claim 13, wherein said circuit comprises a voltage divider within said feedback path of said comparator.

15. A circuit as defined in claim 8, wherein said circuit is configured to receive said input signal from a wheel speed sensor.

16. A circuit as defined in claim 15, wherein said wheel speed sensor is at least one of a variable reluctance sensor or a Hall sensor.

* * * * *

UNITED STATES PATENT AND TRADEMARK OFFICE
CERTIFICATE OF CORRECTION

PATENT NO. : 6,407,605 B1
DATED : June 18, 2002
INVENTOR(S) : Gerard O. McCann

It is certified that error appears in the above-identified patent and that said Letters Patent is hereby corrected as shown below:

Column 6,
Lines 43-44, "0.1.$\mu$F," should be -- .1.$\mu$F, --

Column 8,
Line 33, "1 ratio" should be -- ratio --

Column 9,
Line 41, "in claim 5," should be -- in claim 4, --

Signed and Sealed this

Third Day of December, 2002

JAMES E. ROGAN
*Director of the United States Patent and Trademark Office*